US011622467B2

(12) United States Patent
Mckeever et al.

(10) Patent No.: US 11,622,467 B2
(45) Date of Patent: Apr. 4, 2023

(54) NETWORK SWITCH MOUNTING SYSTEM

(71) Applicant: INTERNATIONAL BUSINESS MACHINES CORPORATION, Armonk, NY (US)

(72) Inventors: Eric James Mckeever, Pleasant Valley, NY (US); Edward J. Seminaro, Milton, NY (US); David P. Graybill, Staatsburg, NY (US); Benjamin Lyndgaard, Hopewell Junction, NY (US); Wayne A. Barringer, Wallkill, NY (US)

(73) Assignee: International Business Machines Corporation, Armonk, NY (US)

( * ) Notice: Subject to any disclaimer, the term of this patent is extended or adjusted under 35 U.S.C. 154(b) by 371 days.

(21) Appl. No.: 16/578,946

(22) Filed: Sep. 23, 2019

(65) Prior Publication Data

US 2021/0092859 A1 Mar. 25, 2021

(51) Int. Cl.
*H05K 7/14* (2006.01)

(52) U.S. Cl.
CPC ......... *H05K 7/1488* (2013.01); *H05K 7/1489* (2013.01); *H05K 7/1491* (2013.01); *H05K 7/1492* (2013.01); *H05K 7/1487* (2013.01)

(58) Field of Classification Search
CPC .. H05K 7/1488; H05K 7/1489; H05K 7/1491; H05K 7/1492; H05K 7/186
See application file for complete search history.

(56) References Cited

U.S. PATENT DOCUMENTS

| 6,805,418 | B2* | 10/2004 | Milligan | A47B 88/49 |
| | | | | 312/334.47 |
| 8,254,148 | B2* | 8/2012 | Hsiao | H05K 7/1491 |
| | | | | 361/825 |
| 8,400,765 | B2* | 3/2013 | Ross | H05K 7/20836 |
| | | | | 360/99.18 |
| 8,472,183 | B1 | 6/2013 | Ross et al. | |
| 8,737,090 | B2 | 5/2014 | Jai | |
| 9,019,707 | B2* | 4/2015 | Xu | H05K 7/1492 |
| | | | | 361/679.48 |
| 9,451,722 | B2 | 9/2016 | Alshinnawi et al. | |
| 10,251,302 | B2 | 4/2019 | Bachar et al. | |
| 10,334,330 | B2 | 6/2019 | Hasani et al. | |
| 2004/0188362 | A1* | 9/2004 | Liu | H05K 7/1421 |
| | | | | 211/26 |

(Continued)

FOREIGN PATENT DOCUMENTS

EP 1898578 3/2008

*Primary Examiner* — Nidhi Thaker
(74) *Attorney, Agent, or Firm* — Rakesh Roy; Andrew D. Wright; Calderon Safran & Cole, P.C.

(57) ABSTRACT

An assembly includes: a server rack; first side and second side outer rails attached to the rack and positionally fixed relative to the rack; a support device attached to the rack adjacent to a rear of the rack; a computer network switch having a port side positioned adjacent to the rear of the rack; and first side and second side inner rails attached to the network switch and positionally fixed relative to the network switch, the inner rails being slidably attached to the outer rails. The network switch is movable between a retracted position and an extended position, and the support device is located such that the support device physically blocks the network switch from being removed from the rear of the server rack.

20 Claims, 9 Drawing Sheets

(56) References Cited

U.S. PATENT DOCUMENTS

| | | | |
|---|---|---|---|
| 2013/0039005 A1* | 2/2013 | Li | H05K 7/1492 |
| | | | 361/679.48 |
| 2013/0135805 A1* | 5/2013 | Wang | G06F 1/185 |
| | | | 361/679.02 |
| 2015/0076976 A1* | 3/2015 | Bailey | H05K 5/0217 |
| | | | 312/223.1 |
| 2015/0237760 A1 | 8/2015 | Jau et al. | |
| 2015/0334866 A1* | 11/2015 | Bailey | H05K 7/183 |
| | | | 312/223.2 |
| 2017/0181312 A1* | 6/2017 | Chen | H05K 7/1489 |
| 2018/0199470 A1 | 7/2018 | Schmidtke et al. | |
| 2019/0214766 A1 | 7/2019 | Murray | |
| 2019/0215982 A1* | 7/2019 | Chen | H05K 7/183 |
| 2020/0033544 A1* | 1/2020 | Costello | G02B 6/423 |

\* cited by examiner

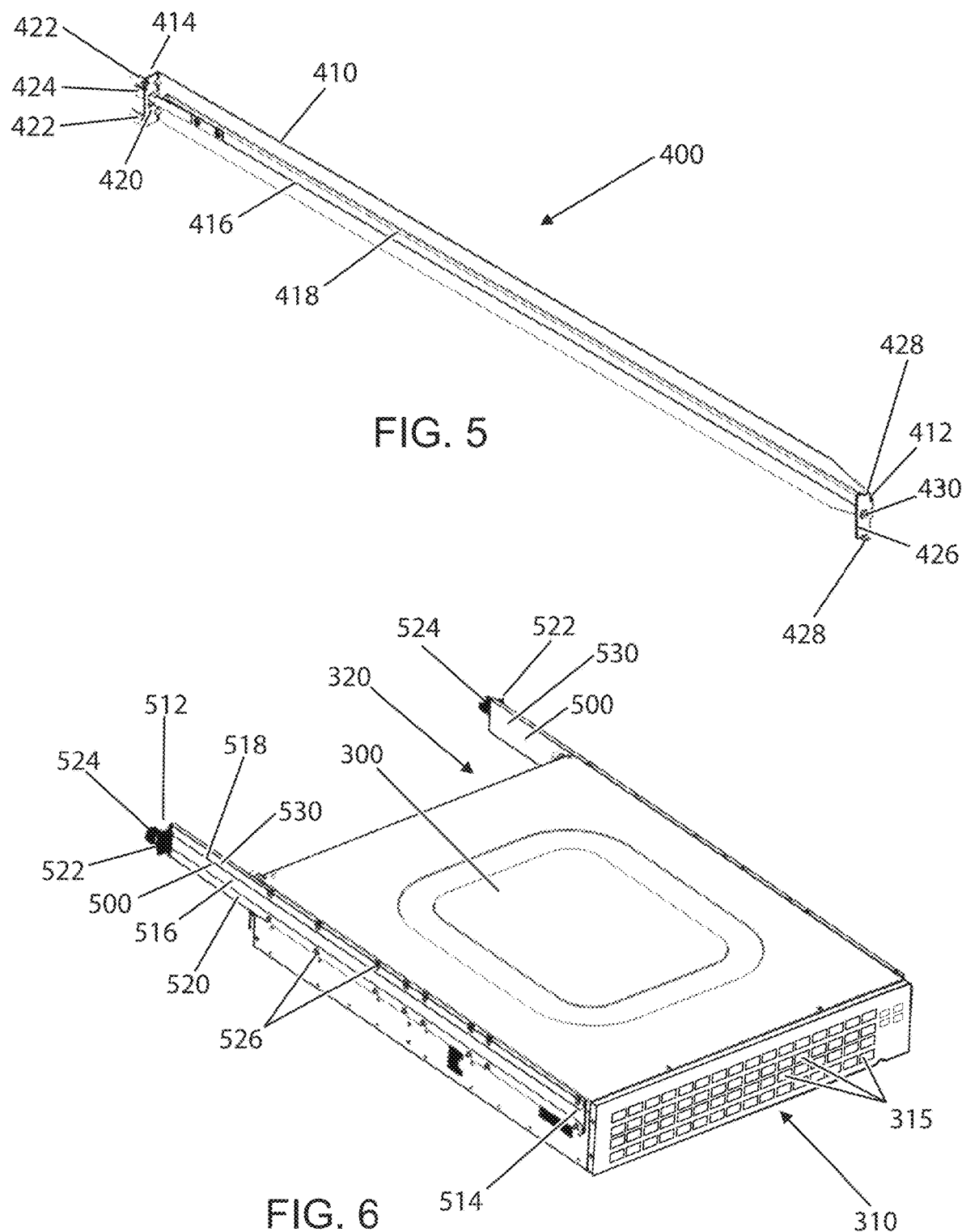

NETWORK SWITCH MOUNTING SYSTEM

BACKGROUND

Aspects of the present invention relate generally to computer server racks and, more particularly, to the mounting of network switches in network server racks.

Network server racks in data centers often contain network switches to attach servers to a system network. Some network server racks have slots or accommodation spaces in which servers, network switches, and other devices are mounted. In some network server racks, a specific height in the network server rack is defined as one rack unit (1U). Some network switches are 1U or greater in height. Network switches are electronics enclosures which can mount into the network server rack using mounting rails on each side of the network switch. In some cases, network cables attach to ports on the network switch on one end of the network switch, commonly referred to as the "port" side of the network switch.

SUMMARY

In a first aspect of the invention, there is an assembly including: a computer network server rack having a first side, a second side, a front, and a rear, the second side being located opposite to the first side, and the rear being located opposite to the front; a first side outer rail attached to the server rack adjacent to the first side of the server rack and positionally fixed relative to the server rack; a second side outer rail attached to the server rack adjacent to the second side of the server rack and positionally fixed relative to the server rack; a support device attached to the server rack adjacent to the rear of the server rack; a computer network switch having a port side positioned adjacent to the rear of the server rack, and a non-port side opposite to the port side, the port side having a plurality of ports configured to be connected to network cables; a first side inner rail attached to the network switch and positionally fixed relative to the network switch, the first side inner rail being slidably attached to the first side outer rail; and a second side inner rail attached to the network switch and positionally fixed relative to the network switch, the second side inner rail being slidably attached to the second side outer rail. The computer network switch is movable between a retracted position and an extended position, and the support device is located such that the support device physically blocks the network switch from being removed from the rear of the server rack.

In another aspect of the invention, there is a network switch rack-mounting system that allows for a network switch to be removed from a server rack via a non-port side of the network switch. The mounting system includes: a right side mounting rail including a respective inner rail connectable to a right side of the network switch and a respective outer rail connectable to the server rack; and a left side mounting rail including a respective inner rail connectable to a left side of the network switch and a respective outer rail connectable to the server rack. The inner rails slide relative to their respective outer rails, thereby enabling the network switch to translate in and out of the server rack from a side of the server rack frame that is opposite the port side of the network switch. The left and right outer rails can be the same part rotated 180 degrees. The left and right inner rails can also be the same part.

In another aspect of the invention, there is an assembly, including: a computer network server rack having a first side, a second side, a front, and a rear, the second side being located opposite to the first side, and the rear being located opposite to the front; a first side outer rail attached to the server rack adjacent to the first side of the server rack and positionally fixed relative to the server rack; a second side outer rail attached to the server rack adjacent to the second side of the server rack and positionally fixed relative to the server rack; a support device attached to the server rack adjacent to the rear of the server rack; an accommodation space in the server rack configured to receive a computer network switch that has a port side positioned adjacent to the rear of the server rack, and a non-port side opposite to the port side, the port side having a plurality of ports configured to be connected to network cables; a first side inner rail configured to attach to the network switch and be positionally fixed relative to the network switch, the first side inner rail being slidably attached to the first side outer rail; and a second side inner rail configured to attach to the network switch and be positionally fixed relative to the network switch, the second side inner rail being slidably attached to the second side outer rail. The first side inner rail and the second side inner rail are movable between a retracted position and an extended position, and the support device is located such that the support device physically blocks the at least one of the first side inner rail and the second side inner rail from being removed from the rear of the server rack.

BRIEF DESCRIPTION OF THE DRAWINGS

Aspects of the present invention are described in the detailed description which follows, in reference to the noted plurality of drawings by way of non-limiting examples of exemplary embodiments of the present invention.

FIG. 5 shows a perspective view of an exemplary outer rail in accordance with embodiments of the invention.

FIG. 6 shows a rear perspective view of an exemplary network switch in accordance with embodiments of the invention.

DETAILED DESCRIPTION

Figure 1:
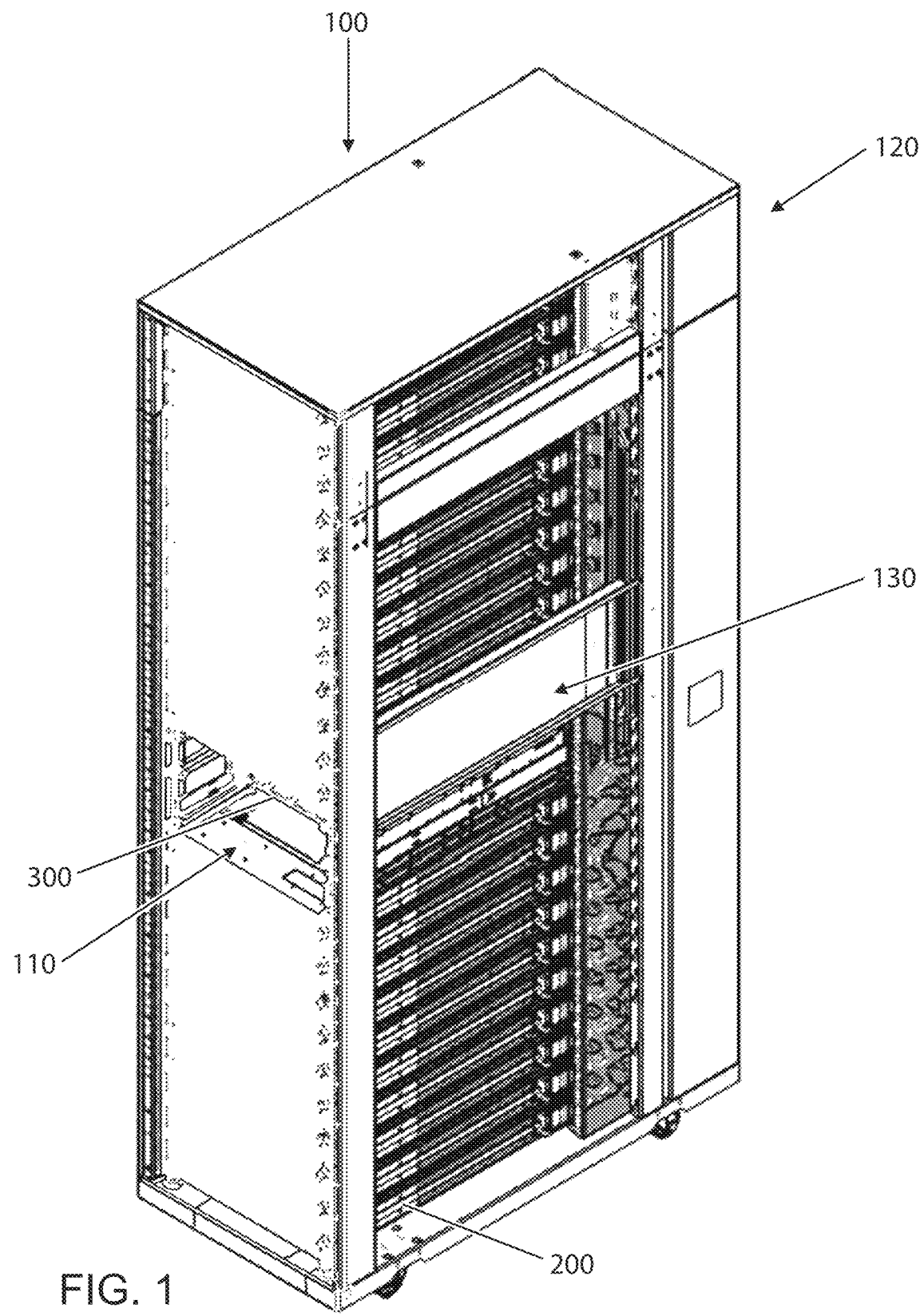
FIG. 1 shows a front perspective view of an exemplary network server rack in accordance with embodiments of the invention.

Aspects of the present invention relate generally to computer server racks and, more particularly, to the mounting of network switches in network server racks. According to aspects of the invention, a network server rack includes network servers, network switches, and support devices such as, for example, power distribution units (PDUs). In embodiments, the support devices are located at a rear of the network server rack and protrude laterally to conserve space in the network server rack (space that is used to allow the use of network servers having a greater depth in the direction from the front of the network server rack to the rear of the network server rack). Such a configuration prevents the network switches from being removed from the rear of the network server rack due to the support devices blocking the space through which the network server would have to pass if the network server was removed from the rear of the network server rack. In embodiments, sliding rails are attached to the network switches and to a frame of the network server rack to allow the network switches to slide toward the front of the network server rack. In this manner, implementations of the invention allow the network switches to be removed from the network server rack without removing the support devices from the network server rack.

Some commercial rack mounted network switches are designed to be serviced and removed from the port side of the network switch due, at least in part, to mounting locations being located at the port end of the network switch. Some servers have a length approaching the depth of the network server rack. Some network switches have a length that is less, and sometimes significantly less, than the length of the servers used the network server rack. Network server racks are arranged in the data center to provide service aisles which are wide enough to enable the removal of a server. The side of the network server rack from which the servers are serviced or removed is referred to as the "front" of the network server rack. The front of the network server rack must be clear of cables, power distribution units (PDUs) and other possible obstructions in order to allow the servers to extend from the network server rack for service or removal. The side of the network server rack (opposite to the front side) which contains the cables, PDUs and other items is referred to as the rear of the network server rack.

Embodiments of the invention include a network switch rack-mounting system that provides for removal of a network switch from a network server rack from a non-port side of the switch. Embodiments of the mounting system include a right side mounting rail including an inner rail connectable to a right side of the network switch and an outer rail connectable to a network server rack frame, and a left side mounting rail including an inner rail connectable to a left side of the network switch and an outer rail connectable to the network server rack frame. The inner rails slide relative to their respective outer rails, thereby enabling the network switch to translate in and out of the network server rack frame from a side of the network server rack frame that is opposite a port side of the network switch.

Embodiments include rack mounted network switches that are designed to be serviced and removed from the network server rack in the direction of the port side of the network switch. The front of the network server rack is clear of cables, PDUs and other possible obstructions in order to allow the network servers to extend from the network server rack for service or removal. The rear of the network server rack contains the cables, PDUs and other items.

In embodiments, the network servers have a length that is longer than the length of the network switches. In embodiments, the faces of the port ends of the network switches are aligned, or substantially aligned, with the faces of the port ends of the network servers.

The network switches may be mounted with the ports facing the front of the network server rack or facing the rear of the network server rack. However, particular network switches are always serviced and removed from the port side of the network switch. This can be a result of the faces of the port sides of the network switches being aligned with the faces of the port sides of the network servers, and the network switches being shorter in length than the network servers. Network server racks (or information technology (IT) cabinets) often contain a large number of network servers and a large number of the network switches for these network servers. The network servers connect to the network switches using network cables. Since there are usually many network servers in a network server rack, and each network server usually has two network connections for redundancy, there are a very large number of network cables. Since the network cables occupy significant space in the network server rack, it is advantageous to mount the network switches and the network servers so connections on both the network switches and the network servers are on the same side of the network server rack, eliminating the need to route cables between the front and rear of the network server rack. Routing cables between the front and the rear of the network server rack wastes considerable space in the network server rack and limits the number of network servers that can be installed in the network server rack.

In addition, the increase in cable length required to route the network cables between the front and the rear of the network server rack can require the use of expensive active network cables instead of less expensive passive network cables. Active network cables contain fiber optic transmitters and receivers which greatly increase the cable cost. With the large number of network cables used in a network server rack, using active network cables greatly increases the total cost of the network server rack. Also, eliminating cable routing between the front and the rear of the network server rack allows the use of passive cables, because the cables are substantially shorter. Passive cables are limited to short lengths due to signal integrity limitations and will become limited to shorter lengths as data transfer speeds continue to increase.

In embodiments, PDUs are mounted in the network server rack. In embodiments, the PDUs extend vertically and are mounted vertically on one or both sides of the network server rack to avoid using valuable rack space that can be used for network servers. However, due to their size, PDUs prevent network servers or network switches from being removed from the end of the rack at which the PDUs are mounted if the PDUs extend laterally behind the servers or network switches. In these configurations, the PDUs must be removed to remove a network server or network switch from the end of the network server rack where the PDUs are located.

The above constraints result in a network server rack configuration with the network cables and the PDUs located at the rear of the network server rack. As mentioned, many commercial network switches are designed to be removed from the network server rack in the direction of the port side of the network switch. Due to the presence of the cables and PDUs, the network switches cannot physically be removed from the port side of the network switch without disassembling parts of the network server rack (the PDUs, etc.). In embodiments of the invention, in order to avoid disassembly of the network server rack (other than cable disconnection), the network switches are removed from the non-port side of the network switch, which is the front of the network server rack.

Embodiments of the invention solve the above problem by providing the ability to service and remove a network switch in the direction of the non-port side of the network switch. In embodiments, two inner rails are mounted to the network switch and two outer rails are mounted to the network server rack. The inner rails slide relative to the outer rails to allow the network switch to move in the direction of the non-port side of the network switch, which is, in some embodiments, the front of the network server rack.

Embodiments of the invention implement custom mounting rails which enable network switches to be removed from the non-port side of the switch (in embodiments, the front of the rack). Embodiments of the invention are an improvement over mounting systems that require the network switches to be removed from the port side of the network switch (the rear of the rack), which is impossible without the removal of PDUs and obstructive cabling.

In embodiments, all network cable connections are in the rear of the rack. This configuration eliminates the need to route large numbers of network cables from the network server connections in the rear of the network server rack to the network switch connections on the front of the network server rack. This configuration also reclaims the network server rack space previously used to route network cables, and allows it to be used to house additional network servers. In addition, this configuration reduces the length of the network cables since they do not need to route from the rear of the network server rack to the front of the network server rack. These shorter cable runs also allow the use of less expensive passive network cables instead of more expensive active network cables, thereby saving money and increasing reliability. Passive cables are more reliable than active cables.

In embodiments of the invention, network switches are serviced and maintained from the front of the network server rack in the same manner as servicing and maintaining the network servers. The necessary network cables are unplugged in the rear of the network server rack and the network switch is simply pulled from the network server rack as the network switch slides on the mounting rails. Embodiments of the invention eliminate the need to attempt service on the network switches from the rear of the network server rack where there are numerous cables and other hardware obstructing access to the network switches.

Embodiments of the invention provide the advantage of the network switches being securely mounted on rails and being slidable relative to the network server rack. Embodiments of the invention provide the advantage of eliminating the need for a complex cable management system since neither the network switches nor the network servers are removed from the rear side of the network server rack.

In embodiments of the invention, each network switch has a right side and a left side mounting rail. Each mounting rail has two parts, an inner rail and an outer rail. The inner rail connects to the network switch. The outer rail connects to the network server rack at, for example, a frame of the network server rack. Each inner rail slides relative to its respective outer rail, enabling the network switch to translate in and out of the front of the network server rack when installed. The rails are designed and mounted to enable the network switch to translate in the direction non-port side of the switch. In embodiments of the invention, a thumbscrew (or other fastener) is used on each mounting rail to secure the network switch in the fully retracted position in the network rack.

An example of removing the network switch in accordance with embodiments of the invention involves the following. A technician unplugs the network cabling to the network switch from the network switch from the rear of the network server rack. The technician unplugs the power cabling to the network switch from the front of the network server rack. The technician loosens the captive thumbscrews (located on the front of the network server rack) on the right and left side mounting rails attached to the network switch. The technician pulls the network switch forward, extending the mounting rails and withdrawing the network switch from the front of the network server rack.

In the above example, after service is complete, the technician pushes the network switch back into position, tightens the thumbscrews, plugs the network cables into the network switch from the rear of the network server rack, and plugs the power cables into the network switch from the front of the network server rack. In other embodiments, the power cables and the network cables plug into any combination of the front of the network server rack and the rear of the network server rack.

Figure 2:
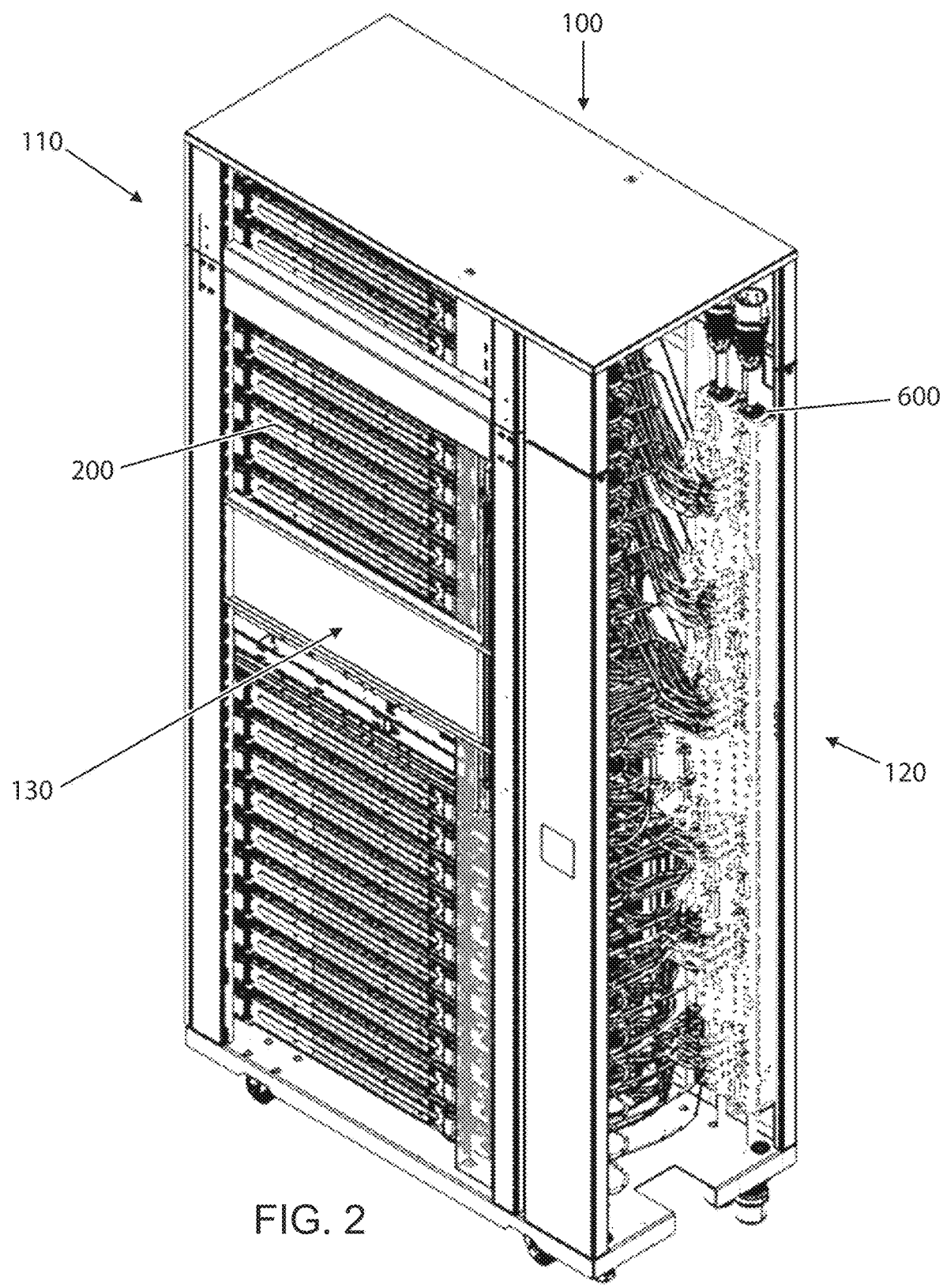
FIG. 2 shows a rear perspective view of an exemplary network server rack in accordance with embodiments of the invention.

FIGS. 1 and 2 show an example of a network server rack 100 in accordance with embodiments of the invention. While embodiments of the invention are described with respect to a network server rack that includes network servers and network switches, it is noted that embodiments of the invention include network server racks that include other combinations of network switches, network servers, and other modules, devices, or components. The example shown in FIGS. 1 and 2 has a front 110, a rear 120, a right side 130, and a left side 140 (see FIG. 7). A plurality of network servers 200, network switches 300, and PDUs 600, as well as associated network cables are shown in FIGS. 1 and 2.

Figure 3:
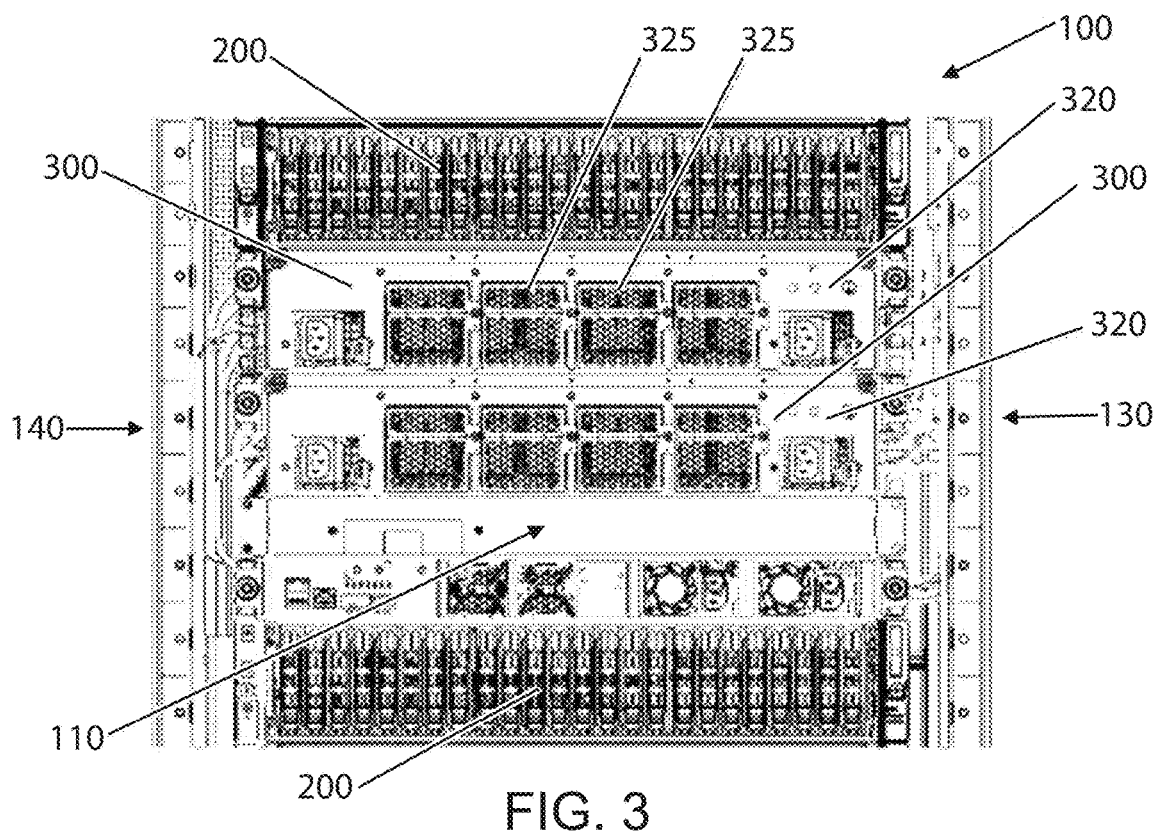
FIG. 3 shows a partial front view of an exemplary network server rack in accordance with embodiments of the invention.
Figure 4:
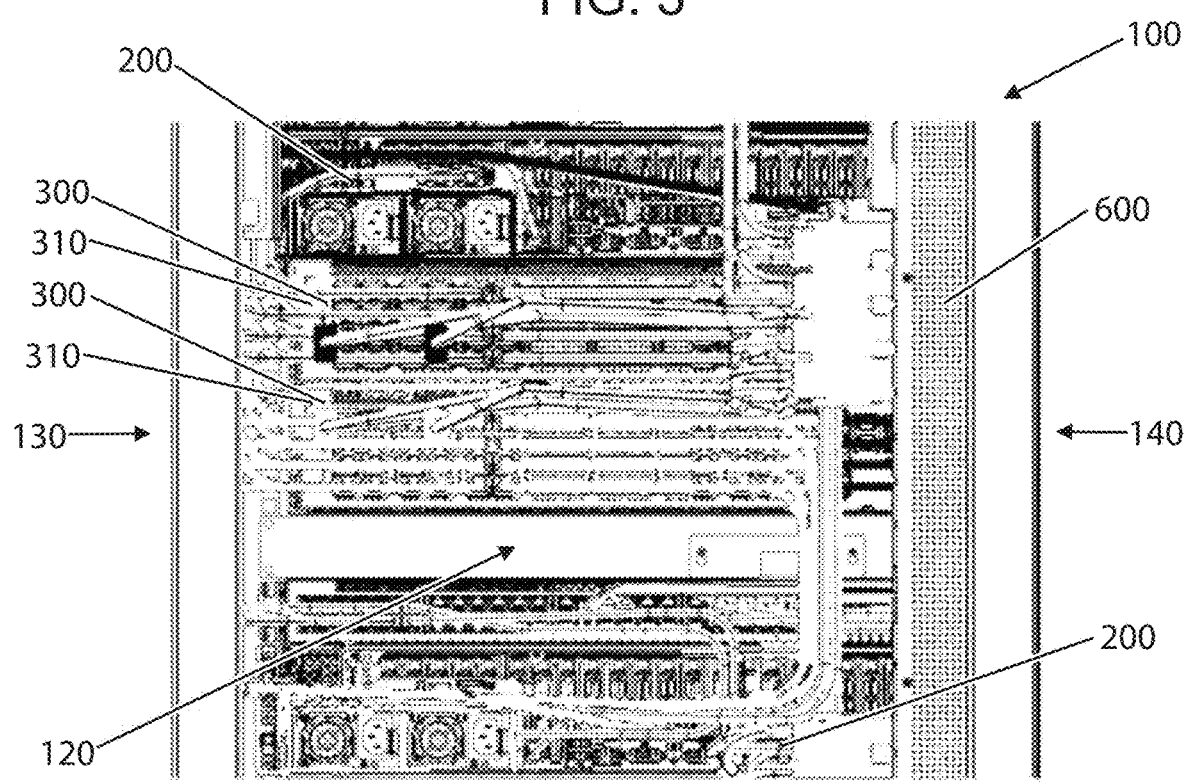
FIG. 4 shows a partial rear view of an exemplary network server rack in accordance with embodiments of the invention.

FIG. 3 shows a partial front view of an example of network server rack 100 and FIG. 4 shows a partial rear view of an example of network server rack 100. FIG. 3 shows two network servers 200 positioned near two network switches 300. In this example, each network switch 300 has a plurality of cooling fans 325 for cooling network switch 300. In this example, network switch 300 has a non-port side 320 that is seen from the front of network server rack 100. The arrangement and number of network servers 200 and network switches 300 shown in FIG. 3 is just one exemplary arrangement. It is noted that other embodiments provide other arrangements.

FIG. 4 shows a rear view of network servers 200 and network switches 300 shown in FIG. 3. In this example, network switch 300 has a port side 310 that includes a plurality of ports 315 (shown in FIG. 6) that receive network cables used to connect network switch 300 to one or more network servers 200 and/or other devices. In this example, port side 310 is seen from the rear of network server rack 100. Various cabling that connects network switches 300, network servers 200, and PDUs 600 is shown in FIG. 4. Other embodiments of the invention have other arrangements of cabling. Also shown in FIG. 4 is a strip of PDUs 600 that provide power to network servers 200, network switches 300, and/or other devices in network server rack 100.

As described above, embodiments of the invention provide a sliding feature that allows the removal of a network switch 300 from front 110 of network server rack 100. Embodiments provide this sliding feature by providing a pair of outer rails that are attached to network server rack 100 and a pair of corresponding inner rails that are attached to network switch 300. In embodiments, the outer rails are attached to a frame of network server rack 100. For simplicity, in this disclosure, it is understood that reference to network server rack 100 includes network server rack 100 as a whole and a frame of network server rack 100.

FIG. 5 shows an example of an outer rail 400 in accordance with embodiments of the invention. In this example, outer rail 400 has a body 410 comprised of a main portion 416 and a central protrusion 418 that protrudes from main portion 416. A front mounting flange 426 is provided at a front end 412 of outer rail 400. In embodiments, front mounting flange 426 has a hole 430 that receives a fastener 524 (shown in FIG. 6) that fastens inner rail 500 and outer rail 400 to network server rack 100. In other embodiments, hole 430 is a threaded hole that receives threads of fastener 524. This embodiment includes two tabs 428 that extend from front mounting flange 426 and engage openings 170 in network server rack 100 (shown in FIG. 10). A rear mounting flange 420 is provided at a rear end 414 of outer rail 400. In this embodiment, rear mounting flange 420 includes two tabs 422 and a spring member 424. In embodiments, tabs 422 are positioned in corresponding slots located near rear 120 of network server rack 100, and spring member 424 engages a corresponding slot in network server rack 100 to removably retain outer rail 400 in network server rack 100.

FIG. 6 shows an example of network switch 300 with an inner rail 500 attached to each side of network switch 300. Inner rail 500 has a main portion 516 with an upper flange 518 and a lower flange 520. In this example, upper flange 518, main portion 516, and lower flange 520 form a "C" shape receiving area that receives outer rail 400. As shown in FIG. 6, inner rail 500 has a front end 512 and a rear end 514. In this example, inner rail 500 has an extension portion 530 extending beyond non-port side 320 of network switch 300. Extension portion 530 is an extension of upper flange 518, main potion 516, and lower flange 520.

In the example shown in FIG. 6, front end 512 of inner rail 500 has a tab 522 that extends substantially perpendicularly from main portion 516. A fastener 524 is attached to tab 522 for fastening inner rail (and therefore network switch 300) to network server rack 100 (discussed in more detail below). In the example shown in FIG. 6, both inner rails 500 have fastener 524. In other examples, only one inner rail 500 has fastener 524. In this example, 524 is a thumb screw. In other examples, fastener 524 is a screw, bolt, quarter-turn fastener, clip, some other fastener that is loosened and tightened without a tool, or some other fastener that is loosened and tightened with a tool. In the example shown in FIG. 6, inner rails 500 are attached to network switch 300 by a plurality of removable fasteners 526 so that inner rails 500 are positionally fixed relative to network switch 300. Examples of fasteners 526 include screws, bolts, clips, and other threaded or other fasteners that are capable of positionally fixing inner rails 500 to network switch 300. In embodiments, inner rails 500 are removable from network switch 300 so that when a first network switch 300 is replaced by a replacement network switch 300, inner rails 500 can be removed from the first network switch 300 and attached to the replacement network switch 300. In other embodiments, inner rails 500 are a permanent part of network switch 300 and are not removable.

In the embodiment shown in FIG. 6, inner rails 500 are attached to network switch 300 such that a top edge of each inner rail 500 is flush with, or substantially flush with, a top surface of network switch 300. In embodiments, this position of inner rails 500 results in a smoother sliding (at least when a small amount of inner outer rail 400 is inside inner rail 500) of inner rails 500 over outer rails 400 due to network switch 300 hanging from outer rails 400. This smoother sliding is the result of having the center of gravity of network switch 300 below the vertical center of inner rails 500. In other embodiments, inner rails 500 are located at a different vertical location on the sides of network switch 300 than the location shown in FIG. 6. In embodiments, one inner rail 500 is located at a different vertical location than the other inner rail 500.

Figure 8:
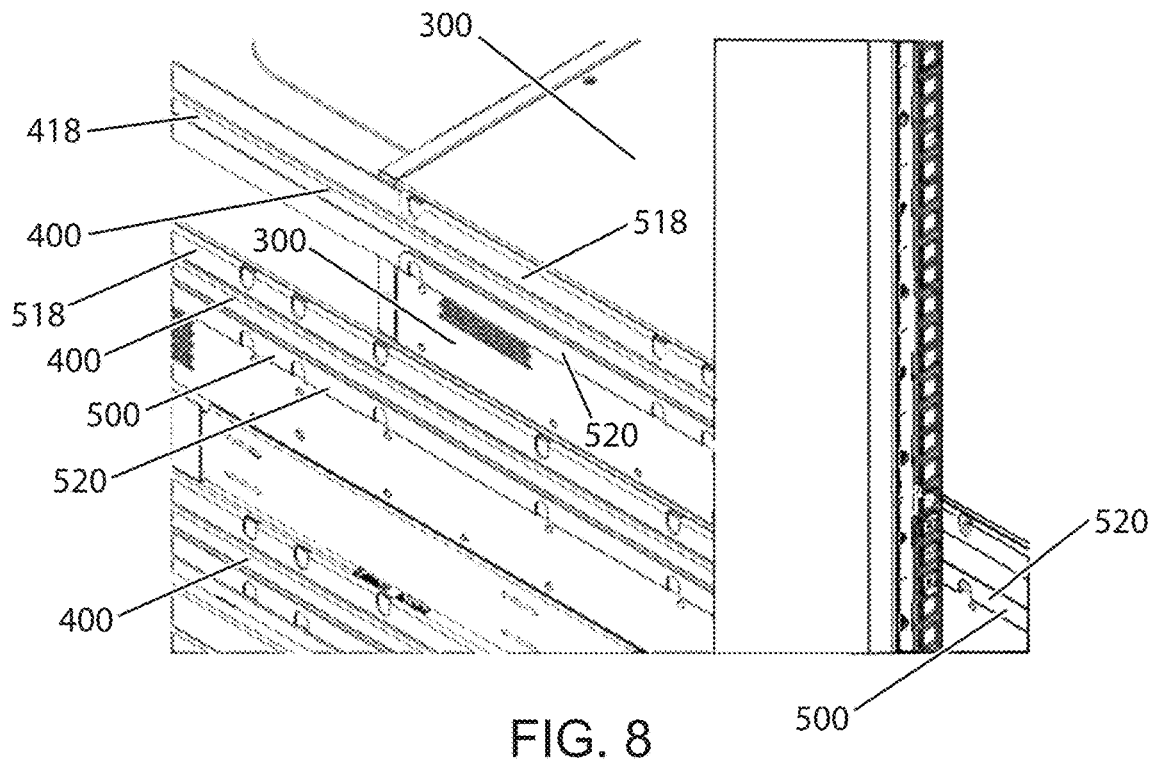
FIG. 8 shows a partial perspective view of an exemplary network server rack in accordance with embodiments of the invention.

In operation, inner rail 500 slides over outer rail 400 such that main portion 416 is received in upper flange 518 and lower flange 520 and central portion 418 of outer rail 400 extends laterally between upper flange 518 and lower flange 520 (as shown in FIG. 8). In this manner, inner rails 500 and outer rails 400 form a sliding, or telescoping, feature that permits network switch 300 to slide in and out of network server rack 100. In embodiments, inner rail 500 is slidable such that inner rail 500 is completely removed from engagement with outer rail 400. Some embodiments comprise an engagement feature such as a clip or spring-loaded plunger that must be disengaged to allow inner rail 500 to be completely removed from engagement with outer rail 400. In embodiments, inner rail 500 is slidable such that inner rail 500 is completely removed from engagement with outer rail 400 without any engagement feature.

Figure 7:
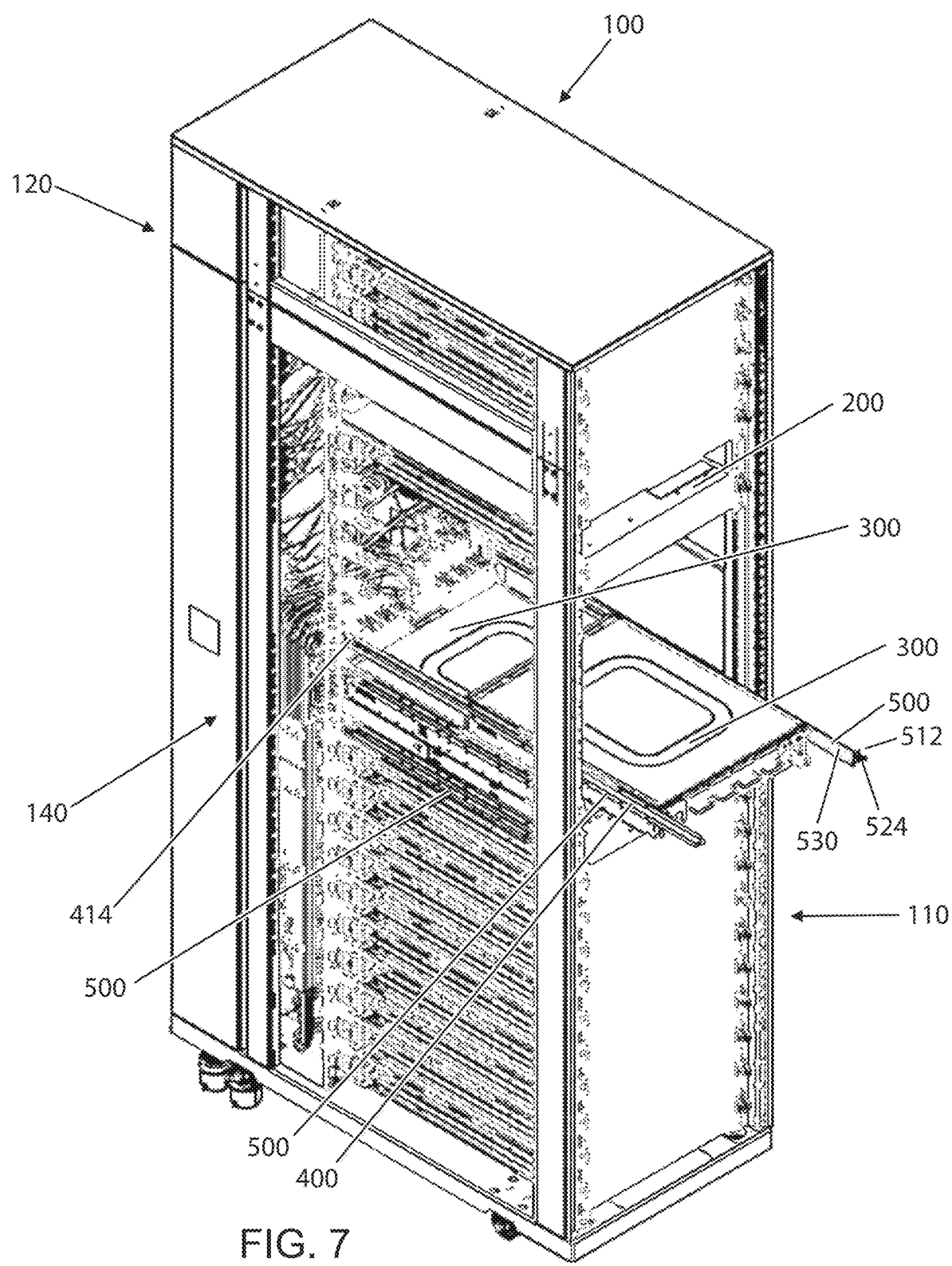
FIG. 7 shows a front perspective view of an exemplary network server rack in accordance with embodiments of the invention.
Figure 9:
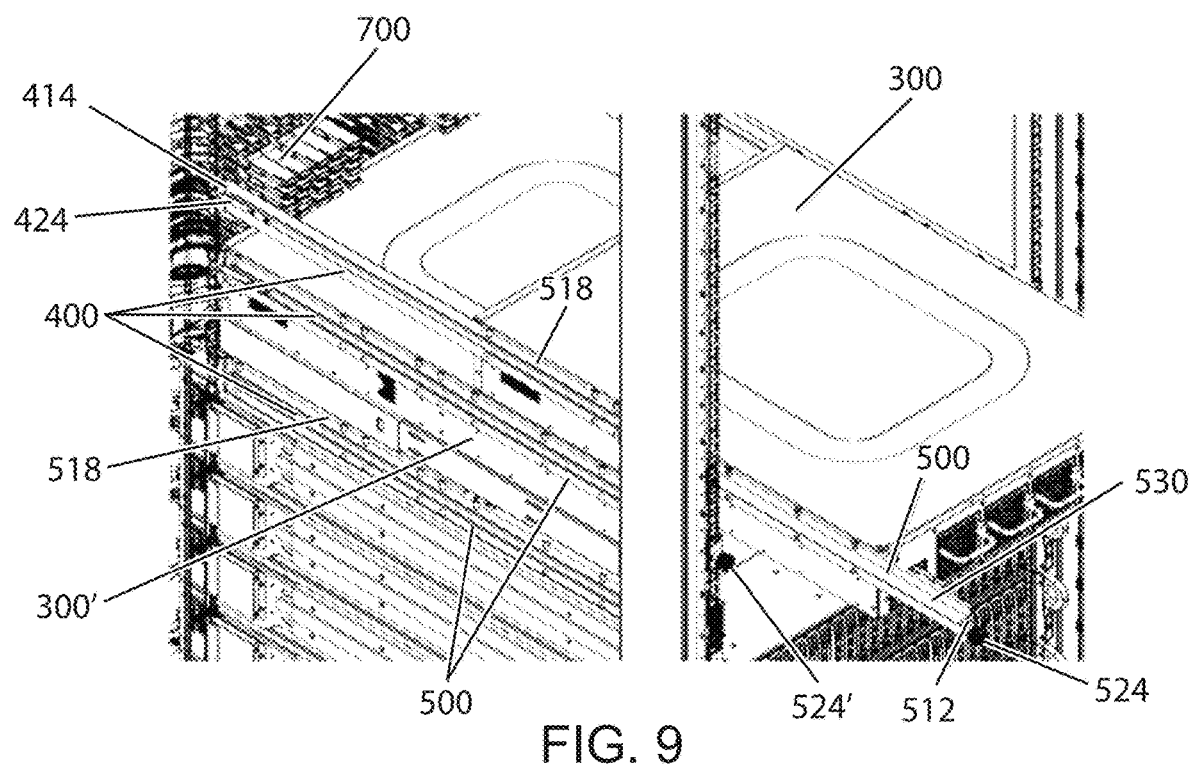
FIG. 9 shows a partial front perspective view of an exemplary network server rack in accordance with embodiments of the invention.

FIG. 7 shows network switch 300 is an extended position where it is moved toward front 110 of network server rack 100. In the example shown in FIG. 7, three network switches 300 are shown located vertically adjacent to one another. Other embodiments comprise fewer or more network switches 300 interspersed between network servers 200 and/or other devices. FIGS. 8 and 9 show larger scale views of a portion of FIG. 7 and show three outer rails 400 and their corresponding inner rails 500. FIGS. 8 and 9 show central portion 418 of outer rail 400 protruding from outer rail 400 and into a gap between upper flange 518 and lower flange 520 of inner rail 500. In embodiments, a lower edge of upper flange 518 contacting an upper surface of central portion 418 and/or an upper edge of lower flange 520 contacting a lower surface of central portion 418 limits a twisting movement of network switch 300 when network switch 300 is moved toward front 110 of network server rack 100. An example of the twisting movement is non-port side 320 of network switch 300 moving downward while port side 310 or network switch 300 moves upward as a result of gravity acting on network switch 300 as it is moved out of network server rack 100. In embodiments, areas of inner rail 500 where main portion 516 meets upper flange 518 and lower flange 520 limit the twisting movement of network switch 300. Particular embodiments limit the twisting movement by both methods discussed above.

FIG. 9 shows one network switch 300 partially removed from network server rack 100 such that extension portions 530 and some of network switch 300 extends outside of network server rack 100. A second network switch 300' located below network switch 300 is secured in position by fastener 524' being fastened to network server rack 100. A plurality of network cables 700 are shown disconnected from network switch 300.

Figure 10:
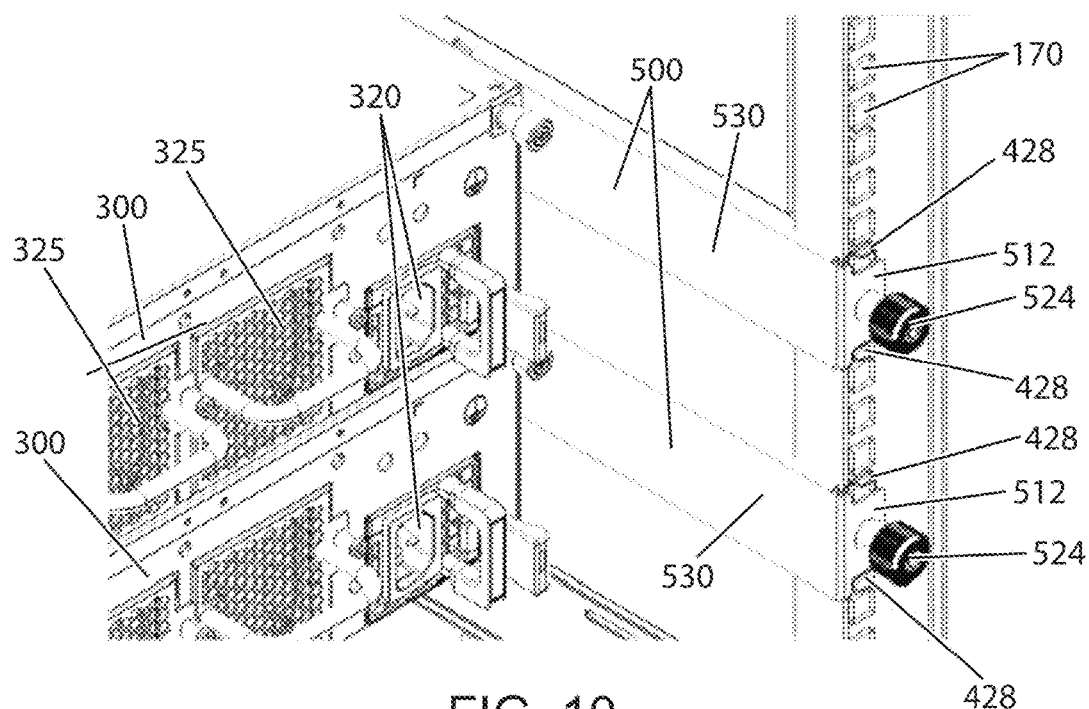
FIG. 10 shows a partial front perspective view of an exemplary network server rack in accordance with embodiments of the invention.
Figure 11:
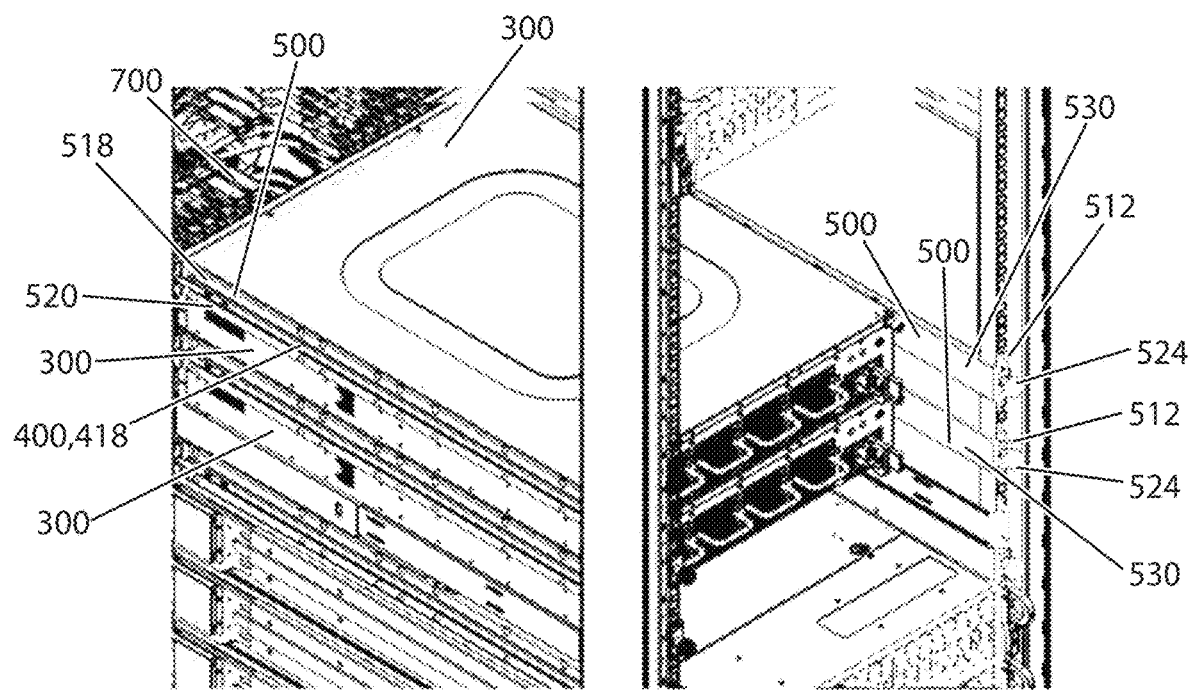
FIG. 11 shows a partial front perspective view of an exemplary network server rack in accordance with embodiments of the invention.

FIGS. 10 and 11 show two network switches 300 in a retracted, or operating, position with fasteners 524 fastened to network server rack 100. FIG. 10 shows tabs 428 of front end 412 of outer rail 400 extending through openings 170 in network server rack 100. In embodiments, fastener 524 extends through on opening 170 and into hole 430 of front mounting flange 426 of outer rail 400 to secure inner rail 500 to outer rail 400 when network switch 300 is in the operating position. In embodiments, securing inner rail 500 to outer rail 400 maintains proper alignment and relative position of inner rail 500 and outer rail 400.

Figure 12:
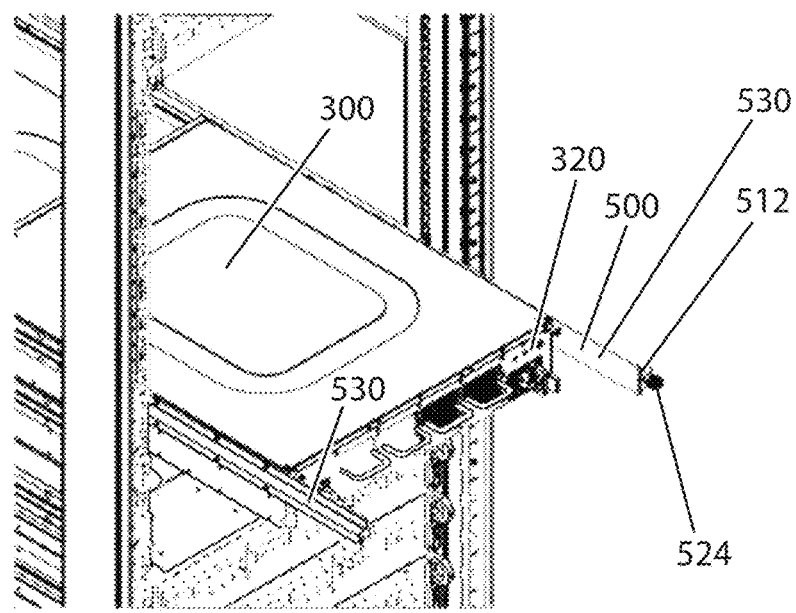
FIG. 12 shows a partial front perspective view of an exemplary network server rack in accordance with embodiments of the invention.
Figure 13:
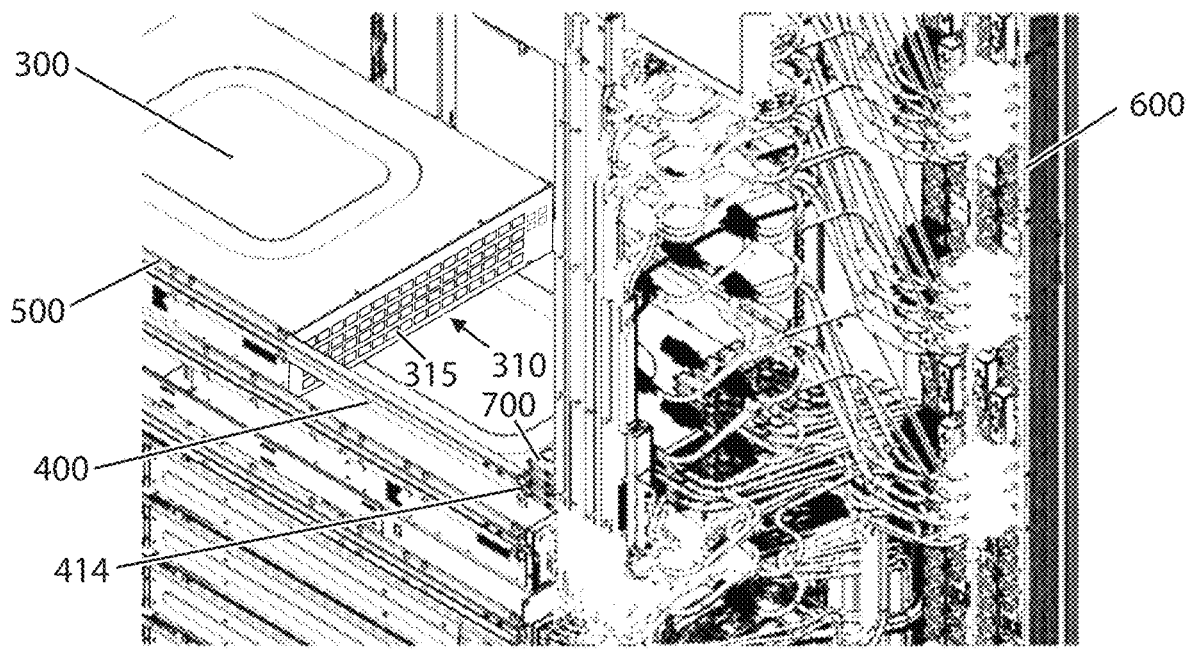
FIG. 13 shows a partial rear perspective view of an exemplary network server rack in accordance with embodiments of the invention.

FIG. 12 shows network switch 300 in a partially removed, or extended, position. FIG. 12 illustrates extension portions 530 extending beyond non-port side 320 of network switch 300. FIG. 13 shows network switch 300 in the extended position shown in FIG. 12, but viewed from port side 310 of network switch 300. Also shown in FIG. 13 are various cables disconnected from ports 315 of network switch 300. For clarity, a rear vertical frame member of network server rack 100 has been removed in FIG. 13 so that more of port side 310 of network switch 300 is shown. Because the rear vertical frame member is not shown in FIG. 13, rear end 414 of outer rail 400 can be seen.

Figure 14:
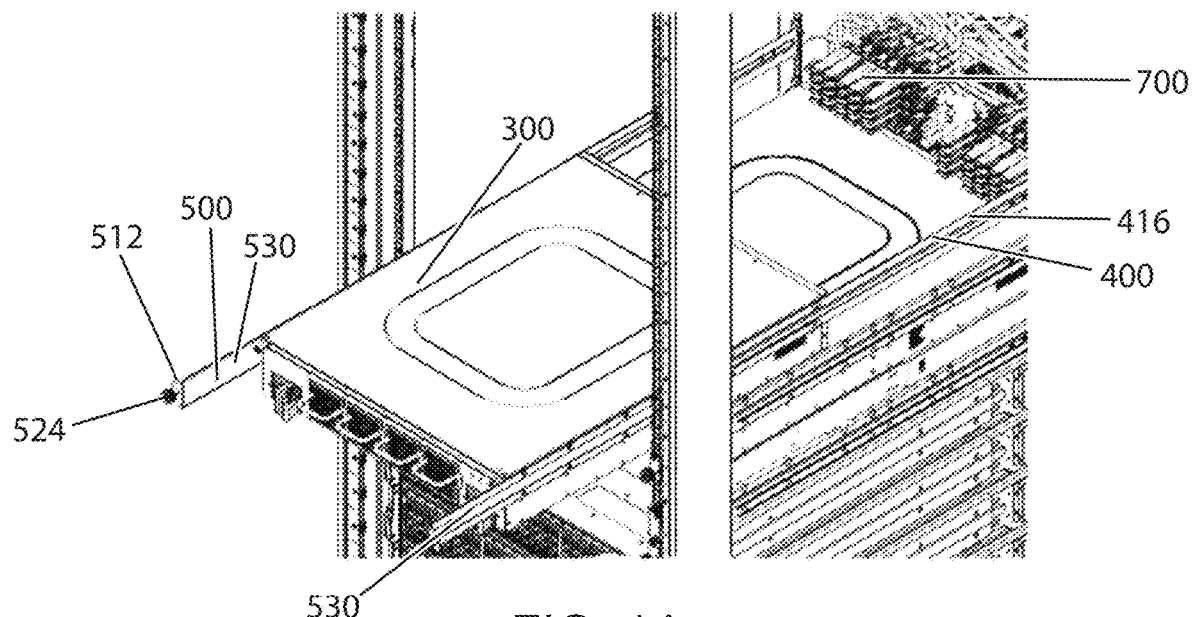
FIG. 14 shows a partial front perspective view of an exemplary network server rack in accordance with embodiments of the invention.
Figure 15:
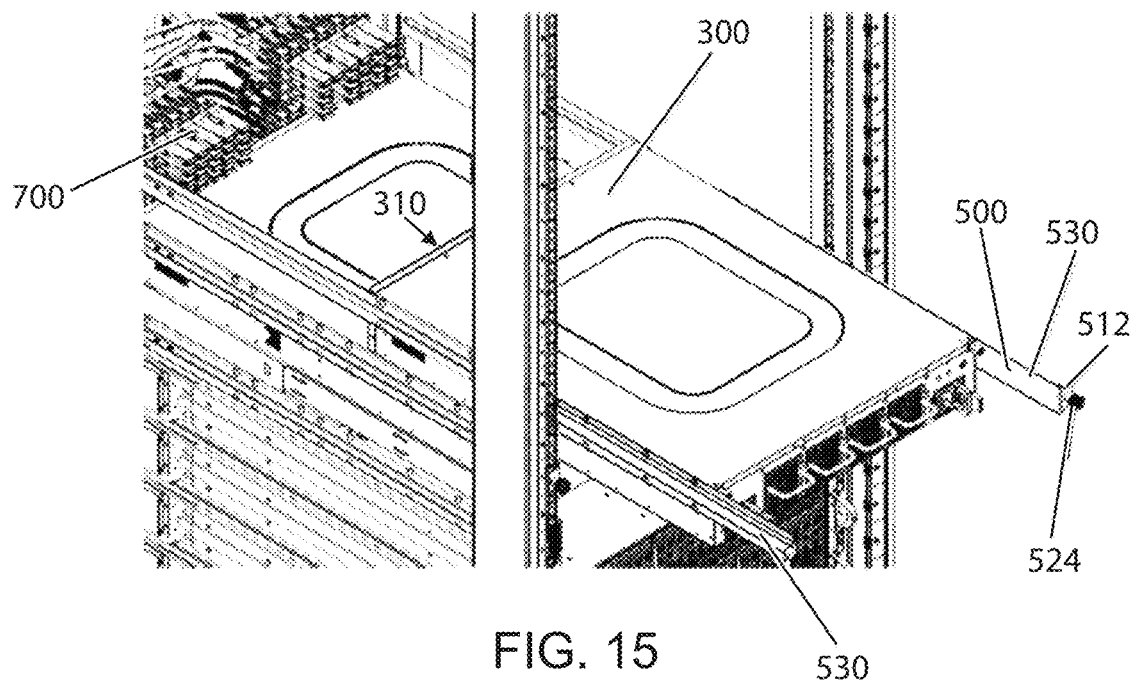
FIG. 15 shows a partial front perspective view of an exemplary network server rack in accordance with embodiments of the invention.

FIGS. 14 and 15 are additional front perspective views of network server rack 100 with network switch 300 in the extended position. FIGS. 14 and 15 show network cables 700 disconnected from network switch 300.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An assembly, comprising:
   a computer network server rack having a first side, a second side, a front, and a rear, the second side being located opposite to the first side, and the rear being located opposite to the front;
   a first side outer rail attached to the server rack adjacent to the first side of the server rack and positionally fixed relative to the server rack;
   a second side outer rail attached to the server rack adjacent to the second side of the server rack and positionally fixed relative to the server rack;
   a support device mounted to the server rack adjacent to the rear of the server rack;
   a computer network switch having a port side positioned adjacent to the rear of the server rack, and a non-port side opposite to the port side, the port side having a plurality of ports configured to be connected to network cables;
   a first side inner rail attached to the computer network switch and positionally fixed relative to the computer network switch, the first side inner rail being slidably attached to the first side outer rail; and
   a second side inner rail attached to the computer network switch and positionally fixed relative to the computer network switch, the second side inner rail being slidably attached to the second side outer rail,
   wherein the computer network switch is movable between a retracted position and an extended position,
   the support device is located such that the support device partially protrudes laterally from the server rack behind the computer network switch such that the support device physically blocks the computer network switch from being removed from the rear of the server rack,
   a power cabling between the computer network switch and the support device is configured to be unplugged to move the first side inner rail and the second side inner rail to the extended position,
   the first side inner rail comprises a main portion, an upper flange extending downward from an upper edge of the main portion, and a lower flange extending upward from a lower edge of the main portion, wherein the main portion, the upper flange, and the lower flange define a receiving area, and
   the first side outer rail comprises a main portion, and the receiving area receives the main portion of the first side outer rail.

2. The assembly of claim 1, wherein the server rack has a depth in a direction from the front of the server rack toward the rear of the server rack,
   the computer network switch has a depth in the direction from the front of the server rack toward the rear of the server rack, and
   the depth of the computer network switch is shorter than the depth of the server rack.

3. The assembly of claim 2, wherein the non-port side of the computer network switch is recessed relative to the front of the server rack when the computer network switch is in the retracted position.

4. The assembly of claim 3, further comprising a network server mounted in the server rack.

5. The assembly of claim 4, wherein the network server has a depth in the direction from the front of the server rack toward the rear of the server rack, and
   the depth of the network server is longer than the depth of the computer network switch.

6. The assembly of claim 5, wherein the first side inner rail has an extension portion extending beyond the non-port side of the computer network switch, and
   the second side inner rail has an extension portion extending beyond the non-port side of the computer network switch.

7. The assembly of claim 6, further comprising a fastener at a distal end of the extension portion of the first side inner rail, the fastener fastening the first side inner rail to the server rack when the computer network switch is in the retracted position,
   wherein the fastener fastens the first side inner rail to the server rack such that the computer network switch is positionally fixed relative to the server rack and the fastener comprises a thumbscrew.

8. The assembly of claim 7, further comprising network cables connected at one end to the computer network switch at the port side of the computer network switch, and connected at another end to the network server at a side of the network server that is adjacent to the rear of the server rack.

9. The assembly of claim 8, wherein all of the network cables between the computer network switch and the network server are located at the rear of the server rack.

10. The assembly of claim 1, wherein the first side outer rail further comprises a central protrusion that protrudes laterally from the main portion of the first side outer rail.

11. The assembly of claim 10, wherein the central protrusion of the first side outer rail extends laterally between the upper flange of the first side inner rail and the lower flange of the first side inner rail.

12. The assembly of claim 11, wherein the central protrusion contacting the lower flange limits a twisting movement of the computer network switch relative to the server rack.

13. The assembly of claim 12, wherein the computer network switch is removable from the server rack by sliding the first side inner rail out of the first side outer rail and sliding the second side inner rail out of the second side outer rail.

14. A network switch rack-mounting system that allows for a network switch to be removed from a server rack having a frame via a non-port side of the network switch, the mounting system comprising: a right side mounting rail including a right side inner rail and a right side outer rail, wherein the right side inner rail includes a respective inner rail connectable to a right side of the network switch and the right side outer rail includes a respective outer rail connectable to the server rack; and a left side mounting rail including a left side inner rail and a left side outer rail, wherein the left side inner rail is a respective inner rail connectable to a left side of the network switch and the left side outer rail includes a respective outer rail connectable to the server rack, wherein the inner rails slide relative to their respective outer rails, thereby enabling the network switch to translate in and out of the server rack from a side of the server rack frame that is opposite the port side of the network switch, the right side inner rail comprises a main portion, an upper flange extending downward from an upper edge of the main portion, and a lower flange extending upward from a lower edge of the main portion, wherein the main portion, the upper flange, and the lower flange define a receiving area, the right side outer rail comprises a main portion, wherein the receiving area of the right side inner rail receives the main portion of the right side outer rail, a support device attached to the server rack adjacent to the rear of the server rack, and a power cabling between the computer network switch and the support device is configured to be unplugged to move the first side inner rail and the second side inner rail to the extended position, wherein the support device is located such that the support device physically blocks the network switch from being removed from the rear of the server rack, and the support device extends vertically keeping space in the server rack free for network switches or network servers and the support device protrudes laterally into the server rack to physically block the network switch from being removed from the rear of the server rack.

15. The system of claim 14, wherein the inner rails respectively comprise an extension portion that is configured to extend beyond the non-port side of the network switch in a direction opposite to the port side of the network switch.

16. The system of claim 15, further comprising a fastener at a distal end of one of the extension portions, the fastener being configured to fasten the distal end of the one of the extension portions to the server rack at the side of the server rack frame that is opposite the port side of the network switch.

17. The system of claim 14, wherein the right side outer rail further comprises a central protrusion that protrudes from the main portion of the right side outer rail, and
a space exists between the upper flange of the right side inner rail and the lower flange of the right side inner rail, and the central protrusion of the right side outer rail extends into the space.

18. An assembly, comprising:
a computer network server rack having a first side, a second side, a front, and a rear, the second side being located opposite to the first side, and the rear being located opposite to the front;
a first side outer rail attached to the server rack adjacent to the first side of the server rack and positionally fixed relative to the server rack;
a second side outer rail attached to the server rack adjacent to the second side of the server rack and positionally fixed relative to the server rack;
a support device attached to the server rack adjacent to the rear of the server rack;
an accommodation space in the server rack;
a computer network switch that has a port side and a non-port side opposite to the port side, the port side having a plurality of ports configured to be connected to network cables, the computer network switch being positioned in the accommodation space and adjacent to the rear of the server rack;
a first side inner rail configured to attach to the computer network switch and be positionally fixed relative to the computer network switch, the first side inner rail being slidably attached to the first side outer rail; and
a second side inner rail configured to attach to the computer network switch and be positionally fixed relative to the computer network switch, the second side inner rail being slidably attached to the second side outer rail,
wherein the first side inner rail and the second side inner rail are movable between a retracted position and an extended position,
the support device is located such that the support device physically blocks the at least one of the first side inner rail and the second side inner rail from being removed from the rear of the server rack and the support device keeps the front clear of obstructions and keeps space free in the server rack for network servers and computer network switches, wherein the support device includes a strip of power distribution units that prevents removal of the first side inner rail or the second side inner rail from the port side without disassembling the support device from the server rack,
a power cabling between the computer network switch and the power distribution unit is configured to be unplugged to move the first side inner rail and the second side inner rail to the extended position, and
upper edges of the first side inner rail and the second side inner rail are flush with a top surface of the computer network switch.

19. The assembly of claim 18, wherein the power distribution units are configured to supply power to the computer network switch, the power distribution unit extends vertically and is directly mounted vertically to the rack.

20. The assembly of claim 19, wherein the first side inner rail has an extension portion configured to extend beyond the non-port side of the computer network switch, and the second side inner rail has an extension portion configured to extend beyond the non-port side of the computer network switch.

\* \* \* \* \*